United States Patent
Lee et al.

(10) Patent No.: US 8,361,841 B2
(45) Date of Patent: Jan. 29, 2013

(54) MOLD ARRAY PROCESS METHOD TO ENCAPSULATE SUBSTRATE CUT EDGES

(75) Inventors: Kuo-Yuan Lee, Kaohsiung (TW); Yung-Hsiang Chen, Kaohsiung (TW); Wen-Chun Chiu, Kaohsiung (TW)

(73) Assignee: Walton Advanced Engineering, Inc., Kaohsiung (TW)

( * ) Notice: Subject to any disclaimer, the term of this patent is extended or adjusted under 35 U.S.C. 154(b) by 136 days.

(21) Appl. No.: 13/093,476

(22) Filed: Apr. 25, 2011

(65) Prior Publication Data

US 2012/0270368 A1    Oct. 25, 2012

(51) Int. Cl.
*H01L 21/00*    (2006.01)

(52) U.S. Cl. ......... 438/113; 438/124; 438/127; 438/462

(58) Field of Classification Search .......... 438/106–127, 438/460–464
See application file for complete search history.

(56) References Cited

U.S. PATENT DOCUMENTS 5,776,798 A * 7/1998 Quan et al. .................... 438/112
5,817,569 A * 10/1998 Brenner et al. ............... 438/460

* cited by examiner

*Primary Examiner* — Richard A. Booth
(74) *Attorney, Agent, or Firm* — Muncy, Geissler, Olds & Lowe, PLLC

(57) ABSTRACT

Disclosed is a mold array process (MAP) method to encapsulate cut edges of substrate units. A substrate strip includes a plurality of substrate units arranged in a matrix. Scribe lines are defined between adjacent substrate units and at the peripheries of the matrix where pre-cut grooves are formed along the scribe lines with a width greater than the width of the scribe lines. An encapsulant is formed on the matrix of the substrate strip to continuously encapsulate the substrate units and the scribe lines to enable the encapsulant to fill into the pre-cut grooves to further encapsulate the cut edges of the substrate units. The cut edges of the substrate units are still encapsulated by the encapsulant even after singulation processes where substrate units are singulated into individual semiconductor packages to prevent the exposure of the plated traces of the substrate units to enhance the moisture resistance capability of the semiconductor packages.

14 Claims, 15 Drawing Sheets

MOLD ARRAY PROCESS METHOD TO ENCAPSULATE SUBSTRATE CUT EDGES

FIELD OF THE INVENTION

The present invention relates to a packaging technology of manufacturing semiconductor packages, and more specifically to a mold array process (MAP) method to encapsulate cut edges of substrate units.

BACKGROUND OF THE INVENTION

Mold Array Process (MAP) is widely implemented in conventional semiconductor packaging technology which can provide lower cost in mass production. A substrate strip comprising a plurality of substrate units arranged in an array serves as chip carriers for a plurality of chips. After semiconductor packaging processes such as die attaching, wire bonding, etc, a molding compound larger than the substrate array is disposed to continuously encapsulate the substrate units and the scribe lines between adjacent substrate units. Then the substrate matrix is singulated along the scribe lines to obtain a plurality of individual semiconductor packages with the cut edges of substrate units exposed.

A window type BGA semiconductor package manufactured by an conventional MAP method for is shown in FIG. 1 and a substrate strip used in the MAP method is shown in FIG. 2. As shown in FIG. 1, a conventional semiconductor package 100 primarily comprises a substrate unit 113, a chip 120, and an encapsulant 130 where the chip 120 is disposed on the top surface 111 of the substrate unit 113. The substrate unit 113 further has a central slot 117 penetrating from the top surface 111 to the bottom surface 112. A plurality of electrodes 122 disposed on the active surface 121 of the chip 120 are aligned to and exposed from the central slot 117. The electrodes 122 of the chip 120 are electrically connected to the substrate unit 113 by a plurality of bonding wires 150 passing through the central slot 117. The encapsulant 130 is disposed on the top surface 111 as well as inside the central slot 117 of the substrate unit 113 to encapsulate the chip 120 and the bonding wires 150. A plurality of solder balls 160 are disposed on the bottom surface 112 of the substrate unit 113 as the external terminals of the semiconductor package 100. However, with the existing MAP technology, the encapsulant 130 can not fully encapsulate the cut edges 116 of the substrate unit 113 from which the core layers and metal traces of the substrate unit 113 are exposed so that moisture would easily diffuse into the semiconductor package 100 leading to reliability issues.

As shown in FIG. 2, a plurality of substrate units 113 are arranged in an array of a conventional substrate strip 110 for being encapsulated by a conventional MAP method. A plurality of scribe lines 114 crisscrossing to each other are defined between adjacent substrate units 113. After die attaching and wire bonding, the substrate units 113 and the scribe lines 114 are encapsulated by the afore encapsulant 130 as shown in FIG. 1 again. The encapsulant 130 is formed by molding, but the portion of the encapsulant 130 above the scribe lines 114 must be removed in the following processes such as singulation to form individual semiconductor packages 100. Therefore, the portion of the encapsulant 130 disposed over the scribe lines 114 would not exist in the final semiconductor packages 100. When the substrate units 113 are singulated along the scribe lines 114, the blade of singulation cuts through the encapsulant 130 and the substrate strip 110 to expose a plurality of cut edges 116 of the substrate units 113 from the cut surfaces of the encapsulant 130, i.e., the cut edges 116 of the substrate units 113 can not be protected by the encapsulant 130. Therefore, after singulation, the plated traces and the core layer are exposed from the cut edges 116 of the substrate units 113 leading to poor moisture resistance and vulnerable for external disturbance. Moreover, the peripheral circuits on the substrate units 113 can easily be damaged by cutting tool during singulation processes leading to electrical short or open issues.

SUMMARY OF THE INVENTION

The main purpose of the present invention is to provide a mold array process (MAP) method to encapsulate cut edges of substrate units where specific pre-cut grooves are formed on a substrate strip to resolve the conventional exposure of cut edges of substrate units to avoid the exposure of metal traces and core layers at the peripheries of substrate units to further improve the moisture resistant capability of semiconductor packages.

According to the present invention, an MAP method to encapsulate the cut edges of the substrate units is disclosed. Firstly, a substrate strip is provided where the substrate strip includes a plurality of substrate units arranged in an N by M matrix. The dimension of each substrate unit corresponds to the dimension of a semiconductor package and a plurality of scribe lines are defined between adjacent substrate units and at the peripheries of the matrix. A plurality of pre-cut grooves with a width greater than the width of the scribe line are formed between adjacent substrate units and at the peripheries of the matrix by a pre-singulating step so that the cut edges of the substrate units are exposed out of the scribe lines. Then, a plurality of chips are disposed on and electrically connected to the substrate units. An encapsulant is formed on the matrix of the substrate strip to continuously encapsulate the substrate units and the scribe lines to enable the encapsulant to fill into the pre-cut grooves to further encapsulate the cut edges of the substrate units. A portion of the encapsulant within the scribe lines is removed by singulation processes to divide the matrix into individual semiconductor packages corresponding to the substrate units with the cut edges of the substrate units still encapsulated by remains of the encapsulant.

The MAP method to encapsulate cut edges of substrate units according to the present invention has the following advantages and effects:
1. Through the filling of the encapsulant into the pre-cut grooves having a width greater than the width of the scribe lines as a technical mean, the cut edges of the substrate units out of the scribe lines are encapsulated by the encapsulant so that during singulation processes, cutting tool only cuts through the encapsulant without cutting at the substrate structure during the MAP method to resolve the conventional exposure of the cut edges of substrate units to avoid the exposure of metal traces and core layers at the cut edges of substrate units to further improve the resistant capability to the impact of environment such as oxidation, moisture, and others to improve the reliability of semiconductor packages.
2. Through the filling of the encapsulant into the pre-cut grooves having a width greater than the width of the scribe lines as a technical mean, the substrate structure will not be damaged during singulation processes of the MAP method to avoid the deformation or shifting of internal circuitry inside the substrate due to the stresses caused by cutting through conventional combination of substrate and encapsulant during singulation processes.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
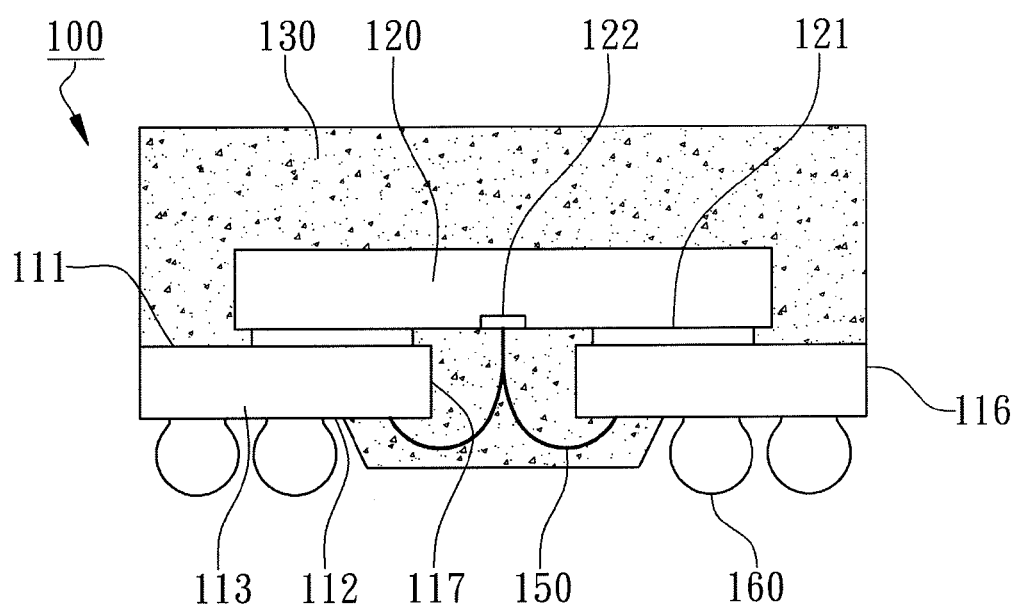
FIG. 1 is a cross-sectional view of a conventional semiconductor package fabricated from a conventional MAP method.
Figure 2:
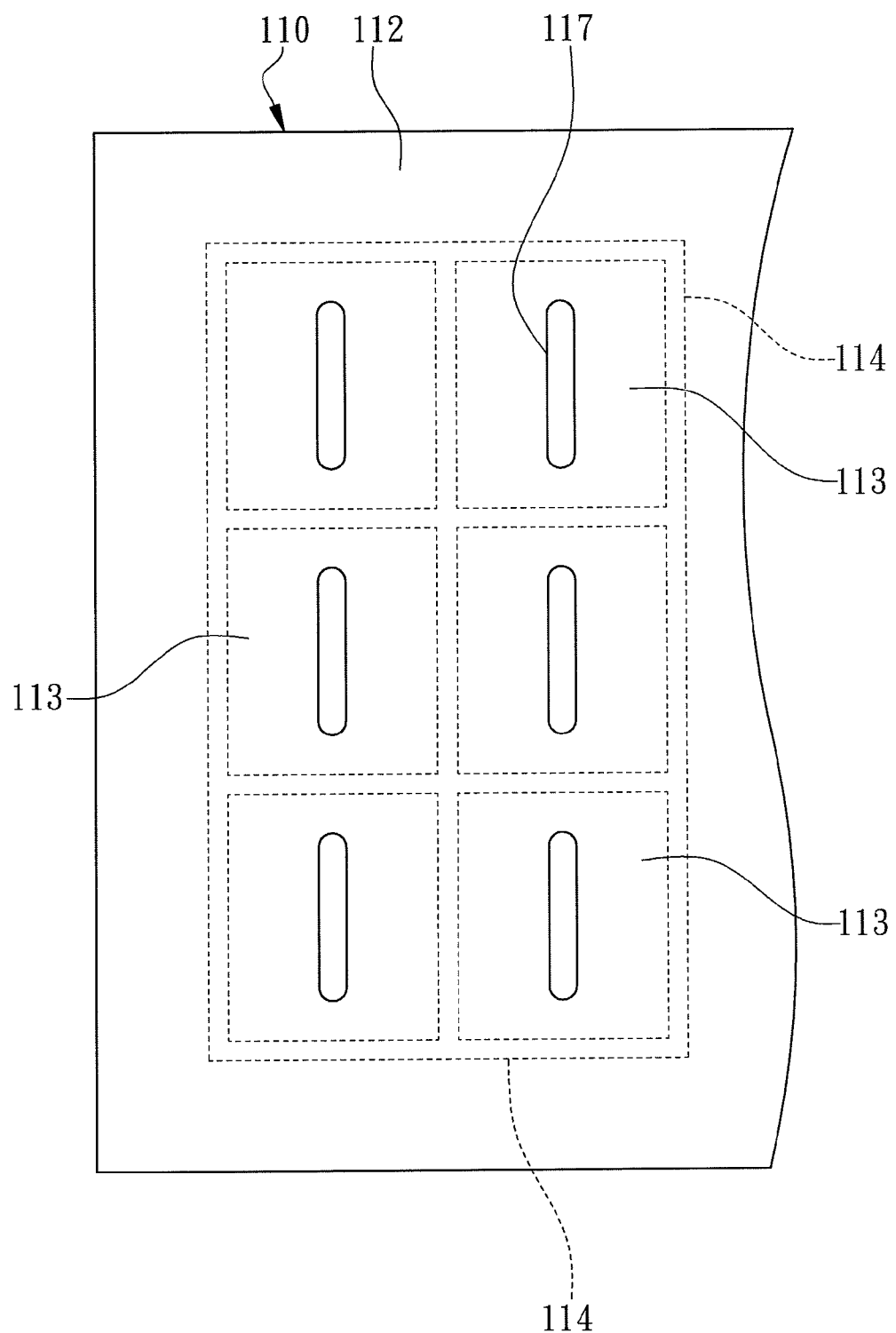
FIG. 2 is a partially top view of a substrate strip for the conventional MAP method.
Figure 3:
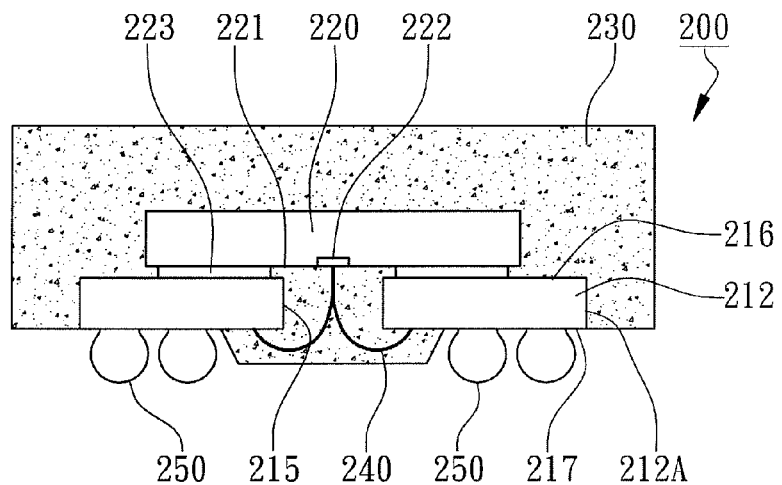
FIG. 3 is a cross-sectional view illustrating a semiconductor package fabricated from a MAP method according to the first embodiment of the present invention.
Figure 4A:
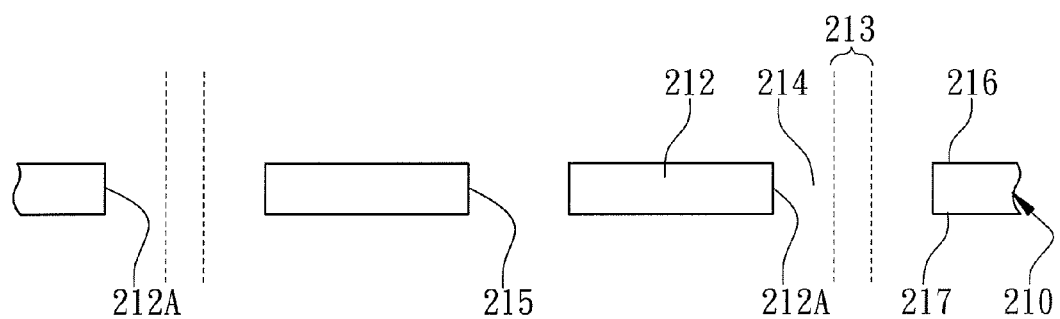
FIGS. 4A to 4F are component cross-sectional views illustrating the processing steps of the MAP method according to the first embodiment of the present invention.
Figure 4B:
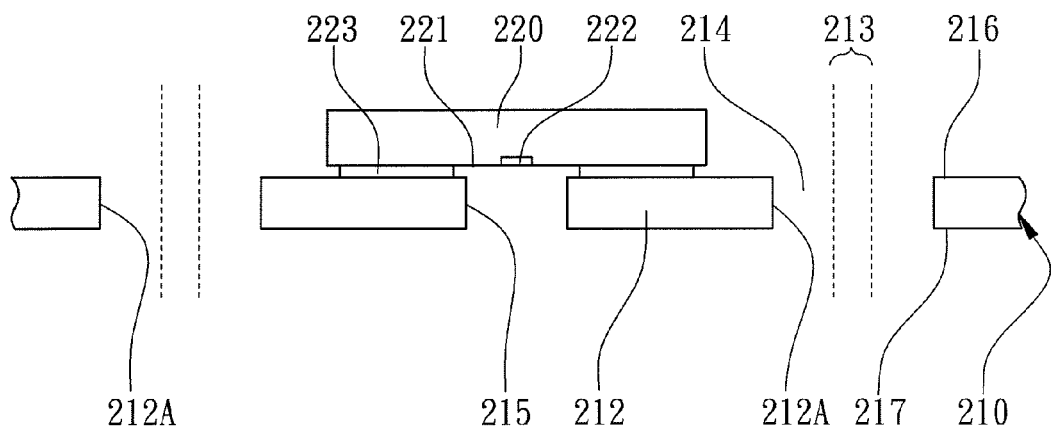
Figure 4C:
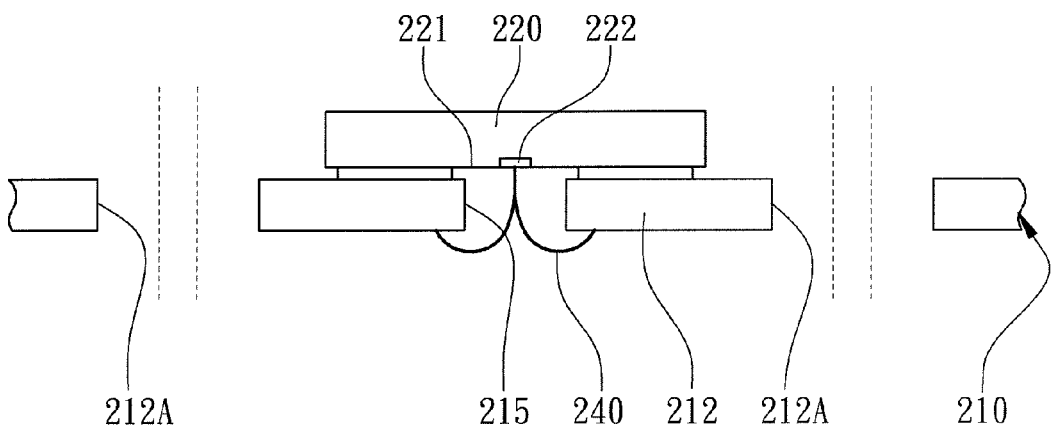
Figure 4D:
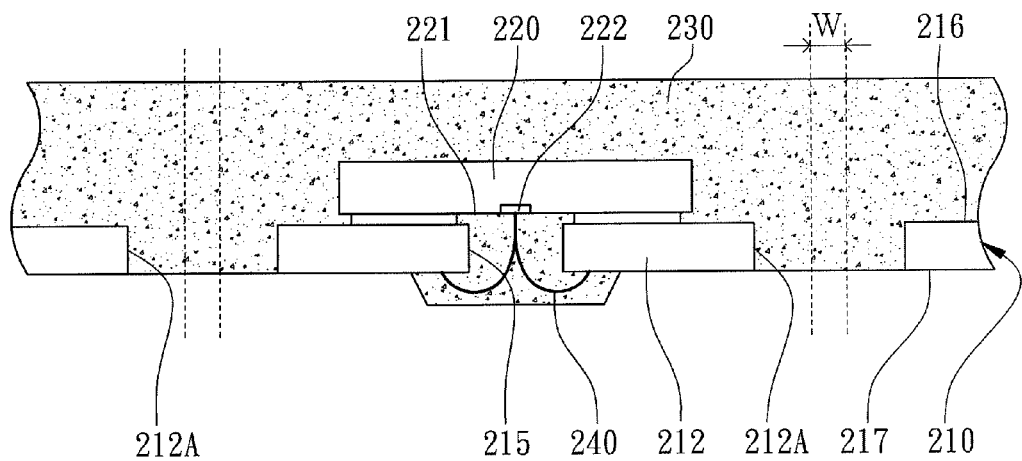
Figure 4E:
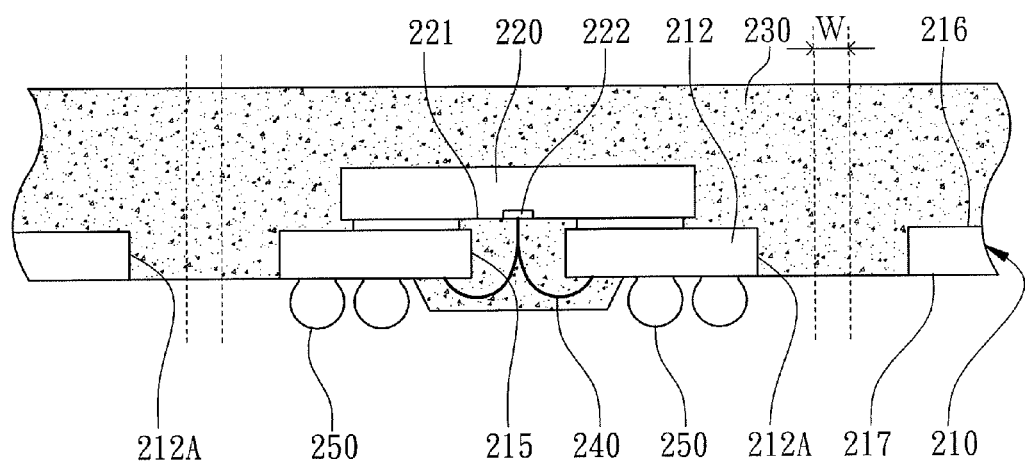
Figure 4F:
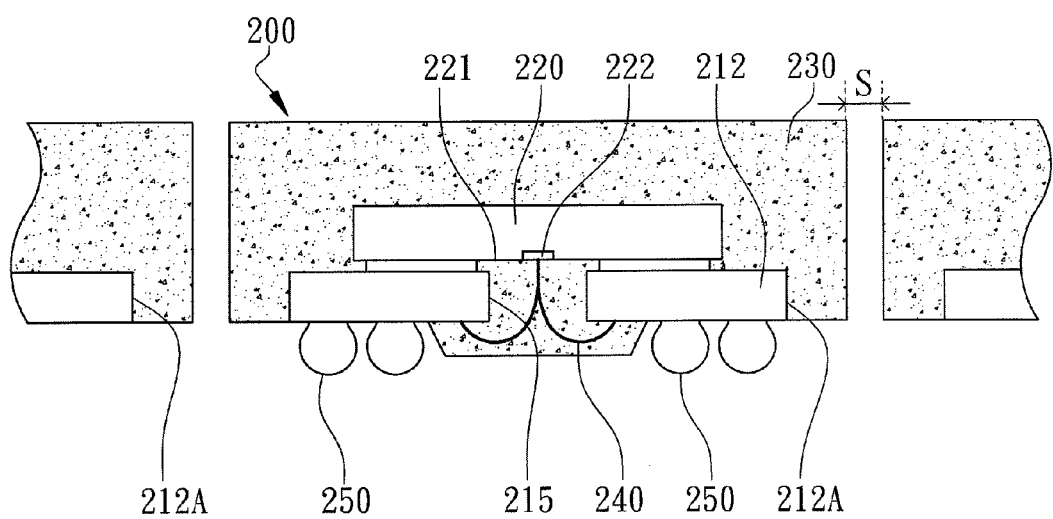
Figure 5:
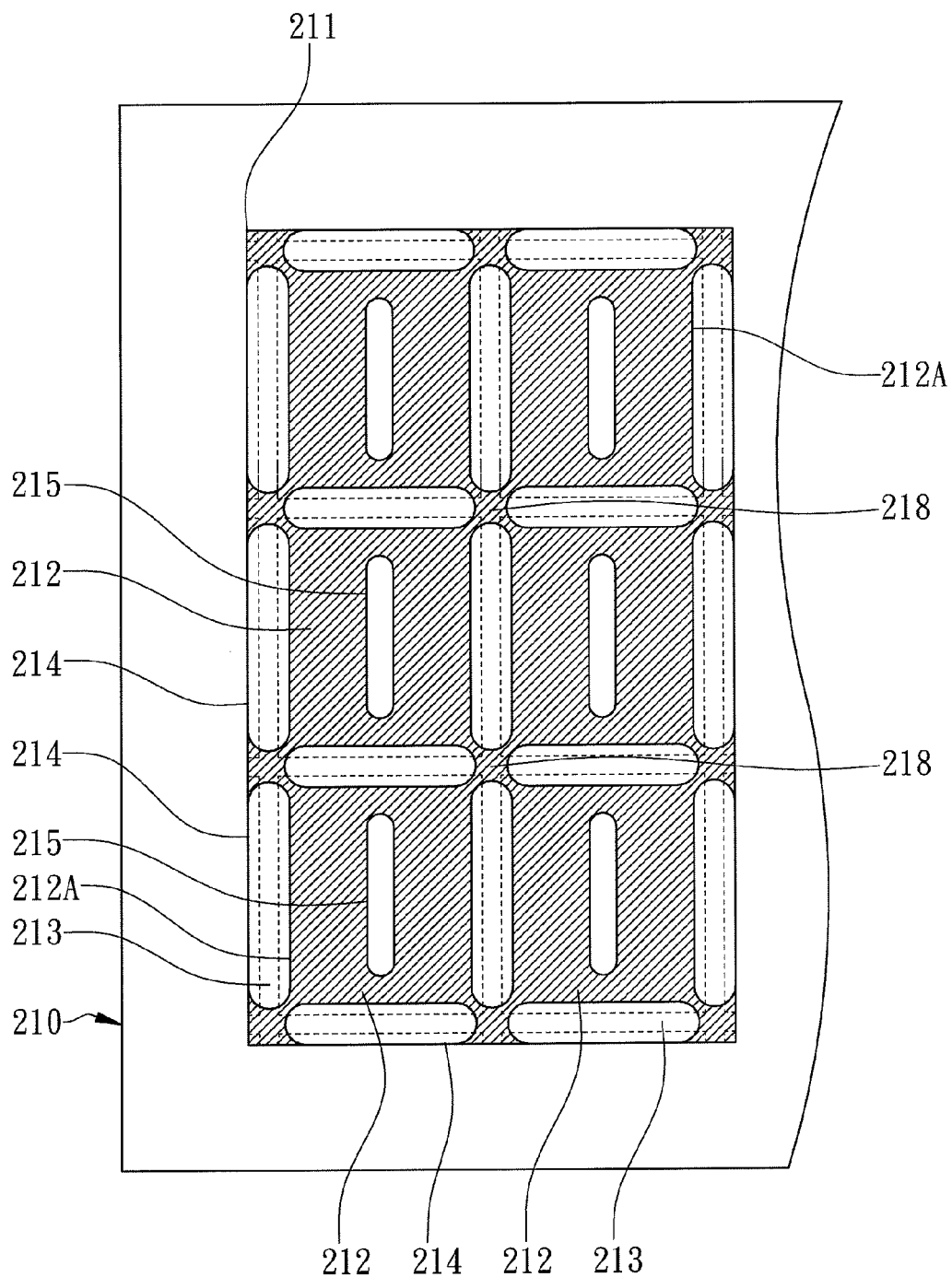
FIG. 5 is a partially top view of a substrate strip provided from the MAP method according to the first embodiment of the present invention.

According to the first embodiment of the present invention, an MAP method to encapsulate cut edges of substrate units is illustrated in FIG. 3 for a component cross-sectional view of a semiconductor package fabricated from the MAP method and FIG. 4A to FIG. 4F for component cross-sectional views during each processing step and FIG. 5 for a partially top view of a substrate strip provided from the MAP method. The MAP method is described in detail as follows.

Firstly, as shown in FIG. 4A and FIG. 5, a substrate strip 210 is provided where the substrate strip 210 includes a plurality of substrate units 212 which are integrally connected in the substrate strip 210 and serve as chip carriers with electrical connections for semiconductor packages. The substrate units 212 are arranged in an N by M matrix 211 where N is two and M is three as shown in FIG. 5 to form a 2 by 3 matrix by a plurality of substrate units 212. In a real product, N can be 5 and M can be 8 to form a 5 by 8 matrix where N and M can be arbitrary numbers to meet the requirements of different automation assembly equipment. That is to say, the substrate units 212 are formed within the substrate strip 210. To be described in detail, the substrate strip 210 is a printed circuit board with single-layer or double-layer metal circuitry for electrical interconnection. Alternatively, the substrate strip 210 also can be a flexible substrate or a ceramic substrate. The substrate strip 210 may has an insulating core material which can be polymer resin such as FR-4 epoxy or other flexible dielectric materials for specific applications such as PI or BT. Furthermore, a central slot 215 is formed at the center of each substrate unit 212 of the substrate strip 210 where the central slot 215 penetrates from the top surface 216 to the bottom surface 217 of the substrate strip 210 to be a wire-bonding channel for window-type BGA packages. The substrate strip 210 further includes a plurality of scribe lines 213 defined between adjacent substrate units 212 and at the peripheries of the matrix 211. As shown in FIG. 5, the dimension of each substrate unit 212 corresponds to the semiconductor package 200 before a pre-singulating step, i.e., the width of the substrate units 212 between two parallel scribe lines 213 before the pre-singulating step as shown in FIG. 5 is the same as the width of the semiconductor package 200 as shown in FIG. 3 in the same orientation of cross-section. By preforming the pre-singulating step of the substrate units 212, a plurality of pre-cut grooves 214 along the scribe lines 213 are formed between adjacent substrate units 212 and at the peripheries of the matrix 211 where the width of the pre-cut grooves 214 is greater than the width of the corresponding scribe lines 213 so that each of the substrate units 212 has a plurality of cut edges 212A exposed from the pre-cut groove 214 out of the scribe lines 213, i.e., two corresponding parallel sides of the pre-cut grooves 214 are the cut edges 212A of the substrate units 212. In a preferred embodiment, the width of the pre-cut grooves 214 is 1.2 times to 2 times greater than the width of the corresponding scribe lines 213. In one embodiment, the pre-cut grooves 214 are formed at the same time as forming the central slots 215 in the same process. The width of the substrate units 212 between two parallel cut edges 212A after the pre-singulating step as shown in FIGS. 3, 4A and 5 is smaller than the width of the semiconductor package 200 as shown in FIG. 3. Preferably, during the pre-singulating step, a plurality of crisscross connecting bars 218 are formed at the corners of the substrate units 212 of the substrate strip 210 to diagonally connect the non-adjacent substrate units 212 together to keep the width of the pre-cut grooves 214 greater than the width of the scribe lines 213 during the MAP processes before encapsulation. The so-called "non-adjacent" means that the cut edges 212A of two of the substrate units 212 are not close to each other and not formed in same pre-cut grooves 214. Except for the connections of the crisscross connecting bars 218, adjacent substrate units 212 are not directly connected to each other. The so-called "diagonally connection" means that the crisscross of each crisscross connecting bar 218 are connected to and aligned to the corners of the substrate units 212 so that the crisscross connecting bar 218 can use the minimum connecting area to connect the substrate units 212.

Then, as shown in FIG. 4B, a plurality of chips 220 are disposed on the corresponding substrate units 212 which can be achieved by the existing die-attaching equipment and processes. To be described in detail, the chips 220 are semiconductor dices having a plurality of IC fabricated on their active surfaces such as memory, logic, or ASIC which are formed by singulation of a wafer. A plurality of electrodes 222 are formed on the active surfaces 221 of the chips 220 as the external terminals for the signal transmission of the chips 220 where the electrodes 222 may be bonding pads made of Al or Cu or conductive bumps extruded from the active surface 221. The electrodes 222 can be arranged in one row, two or more rows at the peripheries, or at the center of the active surfaces 221. Normally, the chips 220 are disposed at central areas of the substrate units 212. In the present embodiment, one chip 220 is disposed on each substrate unit 212, but without any limitation, two or more chips 220 can be stacked and disposed on each substrate unit 212 as multi-chip stacked packages. In the present embodiment, during the disposition of the chips 220, the active surfaces 221 of the chips 220 are attached to the corresponding substrate unit 212 with the electrodes 222 of the chips 220 are aligned within and exposed from the central slots 215. In a preferred embodiment, a die-attaching material 223 is disposed between each chip 220 and the corresponding substrate unit 212 to adhere the chip 220 to the substrate unit 212. Generally speaking, the die-attaching material 223 can be pre-disposed on the top surface 216 of the substrate units 210 or pre-disposed on the active surface 221 of the chip 220 without covering the electrodes 222 at the center of the active surface 221. The die-attaching material 223 can be a doubt-sided PI tape, liquid epoxy, pre-formed film, B-stage adhesive or die-attach material (DAM) to adhere the chip 220 to the corresponding substrate unit 212.

As shown in FIG. 4C, the chips 220 are electrically connected to the corresponding substrate units 212. In the present embodiment, the electrical connection of the chips 220 to the corresponding substrate units 212 is wire-bonding. A plurality of bonding wires 240 are formed by wire bonding technology where the bonding wires 240 pass through the central slots 215 to electrically connect the electrodes 222 of the chip 220 to the bonding fingers of the internal circuitry of the substrate unit 212. The loop height of the bonding wires 240 may be extruded from the bottom surface 217 of the substrate strip 210. The bonding wires 240 are thin metal wires formed by wire-bonding which can be made of gold or similar high conductivity metal such as Cu or Al where the bonding wires 240 are used for signal transmission and power/ground connections between the chips 220 and the substrate units 212. Without any limitation, the chips 220 also can be bumped chips which are electrically connected to the substrate units 212 by flip-chip bonding, inner lead bonding, or other electrical interconnections.

Then, as shown in FIG. 4D, an encapsulant 230 is formed on the matrix of the substrate strip 210 by molding to continuously cover the substrate units 212 and the scribe lines 213 where the encapsulant 230 further fills into the pre-cut grooves 214 to encapsulate the cut edges 212A of the substrate units 212. As shown in FIG. 5, the area drawn by the dash lines inside the substrate strip 210 is the molding area equal to or greater than the matrix 211. Because the molding area covers all of the substrate units 212 and the pre-cut grooves 214 within the matrix, the uncured encapsulant 230 fills into the pre-cut grooves 214 until the cut edges 212A of the substrate units 212 are completely encapsulated. Furthermore, the encapsulant 230 can also fill into the central slots 215 and be extruded from the bottom surface 217 of the substrate strip 210 to encapsulate the bonding wires 240 to further protect the bonding wires 240 from environment disturbance and damages. But without any limitation, the back surface of the chip 220 can be exposed to enhance heat dissipation as a bare-chip package. To be more specific, the encapsulant 230 can be an epoxy molding compound (EMC) with good dielectric and thermosetting properties where the encapsulant 230 can be formed by transfer molding or other encapsulating technology such as compression molding, printing, or spraying.

As shown in FIG. 4E, a plurality of solder balls 250 are disposed on the bottom surface 217 of the substrate unit 212 to be the external terminals for the semiconductor packages after the encapsulating step and before singulation. In a preferred embodiment, the solder balls 250 can be made of tin solder or other appropriate lead-free materials arranged in an array to accommodate more I/O interconnections within the same area of a substrate unit 212 to meet the needs of high-density integration for semiconductor packages. But without any limitation, in different embodiments, the solder balls can be solder paste, contact pads, or contact pins.

As shown in FIG. 4F, the substrate units 212 are re-singulated along the scribe lines 213 to remove a portion of the encapsulant 230 within the scribe lines 213 to become individual semiconductor packages 200. Since the width of the pre-cut grooves 214 is greater than the width of the scribe lines 213, the damages of the substrate units 212 due to the singulation step by removing part of the encapsulant 230 can be avoided and the cut edges 212A of the substrate units 212 are still encapsulated by remains of the encapsulant 230 after the re-singulation processes. The substrate units 212 after the MAP processes are singulated from the substrate strip 210 to obtain a plurality of separate semiconductor packages 200 as shown in FIG. 3. The width S of the removed gap of the encapsulant 230 by the re-singulation processes as shown in FIG. 4F is equal to the width W of the scribe lines 213 as shown in FIG. 4E, therefore, the encapsulant 230 is still encapsulated the cut edges 212A of the substrate units 212 even after the step of removing the encapsulant 230. The substrate structure will not be damaged during the re-singulation processes to avoid the deformation or shifting of internal circuitry inside the substrate strip 210 due to the stresses caused by curing the encapsulant 230 and cutting through the encapsulant 230 during the re-singulation processes.

In the present embodiment, the pre-cut grooves 214 filled with the encapsulant has a width greater than the width of the scribe lines 213 between adjacent substrate units 212 and at the peripheries of the matrix, the encapsulant 230 disposed inside the pre-cut grooves 214 further encapsulates the cut edges 212A of the substrate units 212 and during the re-singulation processes, cutting tool will only cut through the encapsulant 230 without cutting at the substrate structure to resolve the conventional exposure of the cut edges of substrate units to avoid the exposure of metal traces and core layers at the cut edges of substrate units to further improve the resistant capability to the impact of environment such as oxidation, moisture, and others to improve the reliability of semiconductor packages According to the second embodiment of the present invention, another MAP method to encapsulate the cut edges of the substrate units is disclosed which is illustrated from FIG. 6A to FIG. 6H for component cross-sectional views of each processing step to further describe that the present invention can be implemented in different semiconductor packages where the major components with the same functions as in the first embodiment will be described with the same numbers without any further description herein.

Figure 6A:
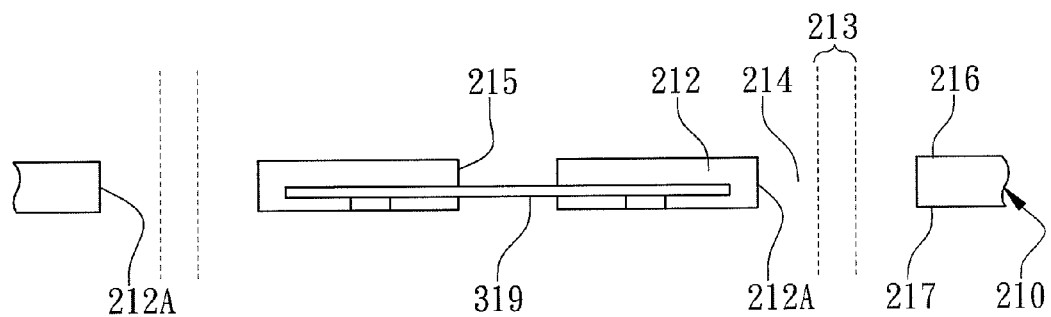
FIGS. 6A to 6H are component cross-sectional views illustrating the processing steps of another MAP method according to the second embodiment of the present invention.

As shown in FIG. 6A, a provided substrate strip 210 includes a plurality of substrate units 212 arranged in an N by M matrix 211. A plurality of pre-cut grooves 214 are formed between adjacent substrate units 212 and at the peripheries of the matrix, wherein the width of the pre-cut grooves 214 is greater than the width of the scribe lines 213 to expose a plurality of cut edges 212A of the substrate units 212 out of the scribe lines 213. In the present embodiment, the substrate strip 210 further has a plurality of inner leads 319 exposed from the central slot 215 of the substrate unit 212 besides the internal circuitry where the inner leads 319 can be the extension of the internal metal circuitry or additional suspended inner leads. The inner leads 319 are made of copper traces with plated finish which can be formed by etching metal foils such as Cu foils or by plating conductive foils to have flexibility. Before electrical connection, the inner leads 319 pass and suspend over the central slots 215.

Figure 6B:
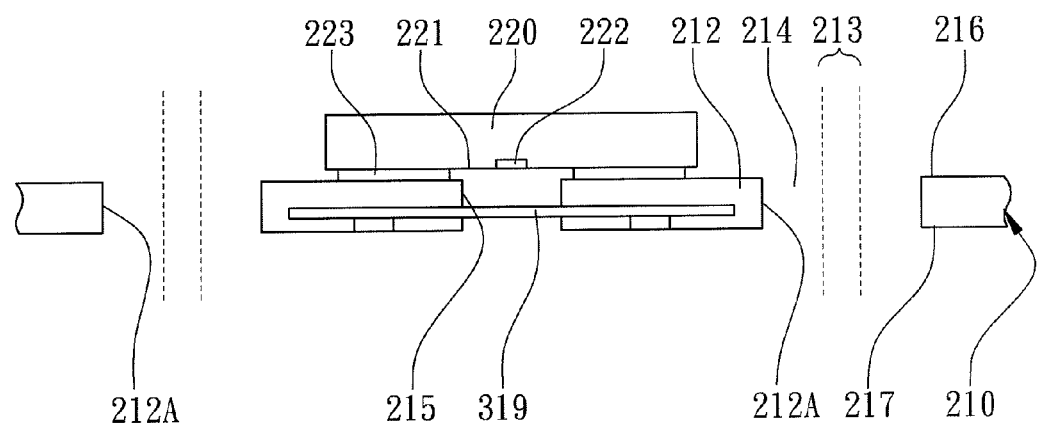

As shown in FIG. 6B, a plurality of chips 220 are disposed on the substrate units 212 where the active surfaces 221 of the chips 220 are faced toward the top surfaces 216 of the substrate strip 210 with a plurality of electrodes 222 of the chips 220 aligned to and exposed from the central slots 215 of the substrate units 212.

Figure 6C:
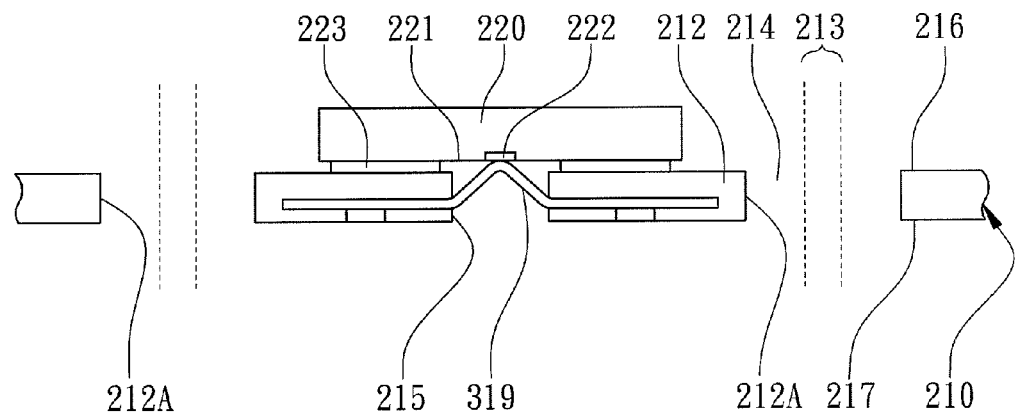

As shown in FIG. 6C, the inner leads 319 passing over the central slots 215 of the substrate strip 210 are electrically connected to the electrodes 222 of the chips 220 without any loop heights of bonding wires extruded from the bottom surface 217 of the substrate strip 210 to further reduce the overall package thickness. The inner leads 319 are broken at the pre-breaking points of the inner leads 319 to electrically connect to the electrodes 222 of the chips 220 for signal transmission by an ILB bonding head.

Figure 6D:
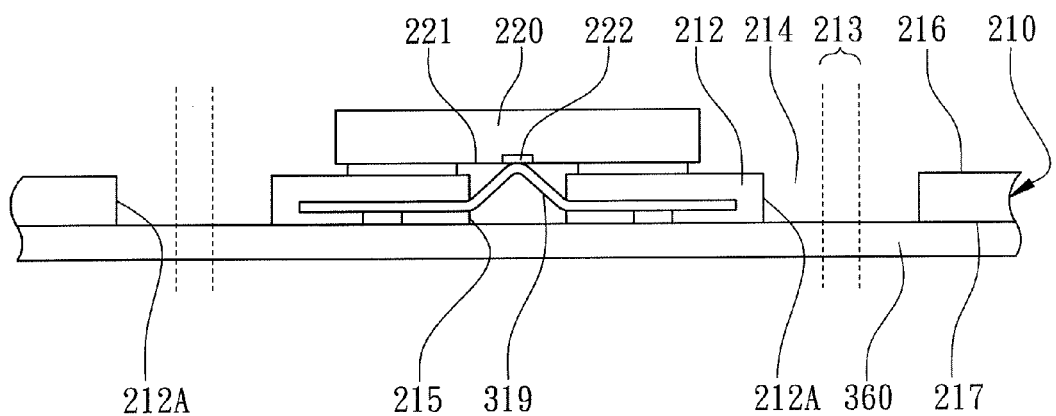

As shown in FIG. 6D, preferably, a protecting tape 360 is attached to the bottom surface 217 of the substrate strip 210 to firmly seal the central slot 215 and the bottom opening of the pre-cut grooves 214 to avoid overflow of the encapsulant 230 from the central slots 215 and from the pre-cut grooves 214 to the bottom surface 217 of the substrate strip 210 during the following encapsulating processes.

Figure 6E:
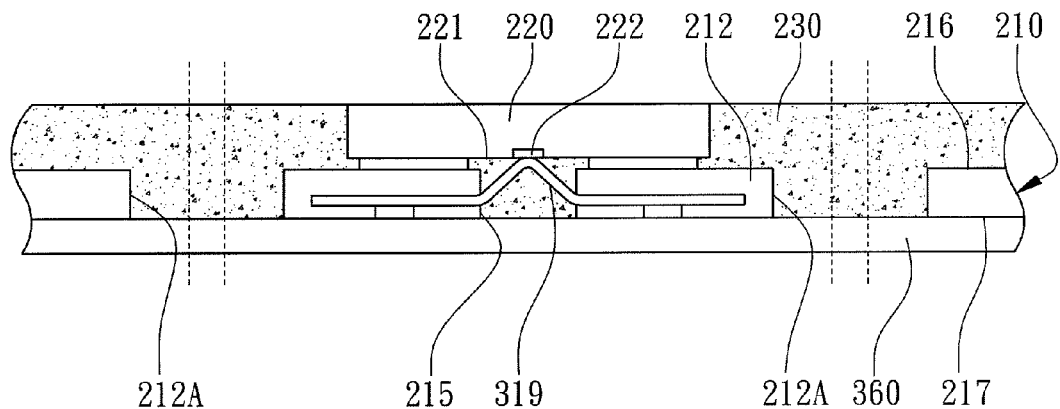
Figure 6F:
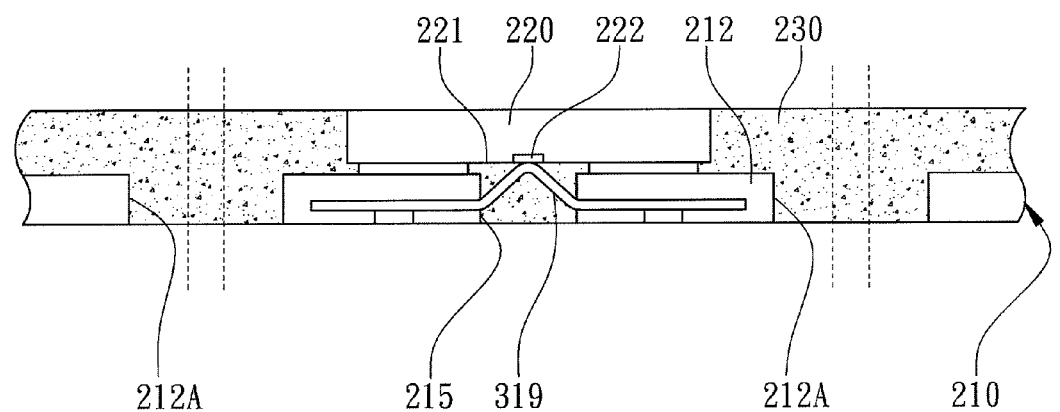

As shown in FIG. 6E, an encapsulant 230 is formed on the matrix of the substrate strip 210 by flat molding to encapsulate the chips 220 where the encapsulant 230 fills into the central slots 215 and the pre-cut grooves 214 to encapsulate the cut edges 212A of the substrate units 212. After the encapsulating processes, as shown in FIG. 6F, the protecting tape 360 is removed from the bottom surface 217 of the substrate strip 210.

Figure 6G:
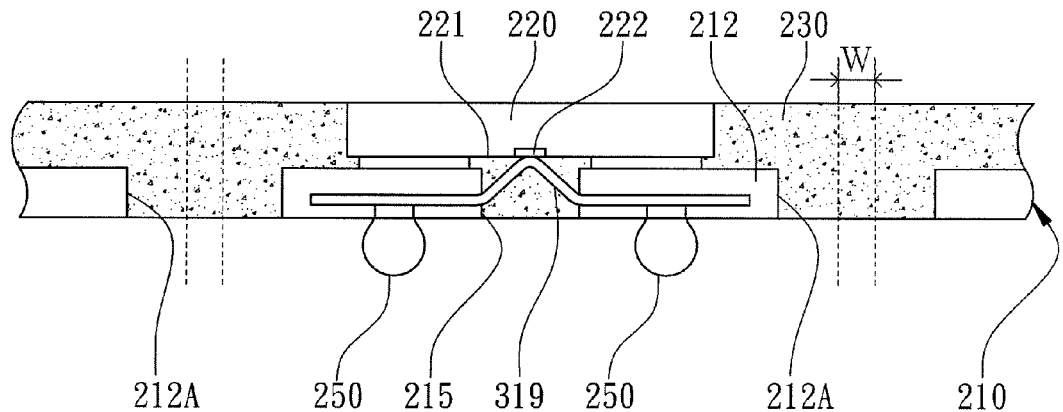
Figure 6H:
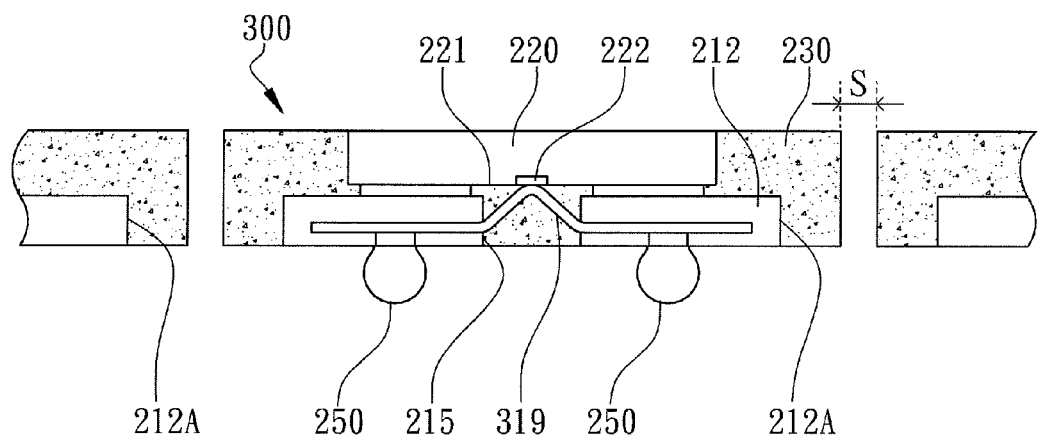

As shown in FIG. 6G, a plurality of solder balls 250 are placed on the bottom surface 217 of the substrate units 212. Then, as shown in FIG. 6H, the substrate units 212 of the substrate strip 210 are re-singulated by removing the portion of the encapsulant 230 within the scribe lines 213 to form a plurality of separate semiconductor packages 300.

According to the third embodiment of the present embodiment, another MAP method to encapsulate the cut edges of the substrate units is disclosed which is illustrated from FIG. 7A to FIG. 7G for component cross-sectional views of each processing step to further describe that pre-cut grooves are not necessary to be formed during the step of providing a substrate strip where the major components with the same functions as in the first embodiment will be described with the same numbers without any further description herein.

Figure 7A:
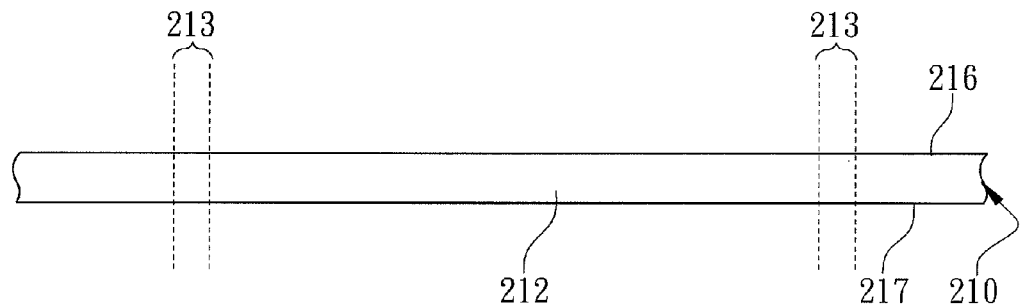
FIGS. 7A to 7G are component cross-sectional views illustrating the processing steps of another MAP method according to the third embodiment of the present invention.
Figure 7B:
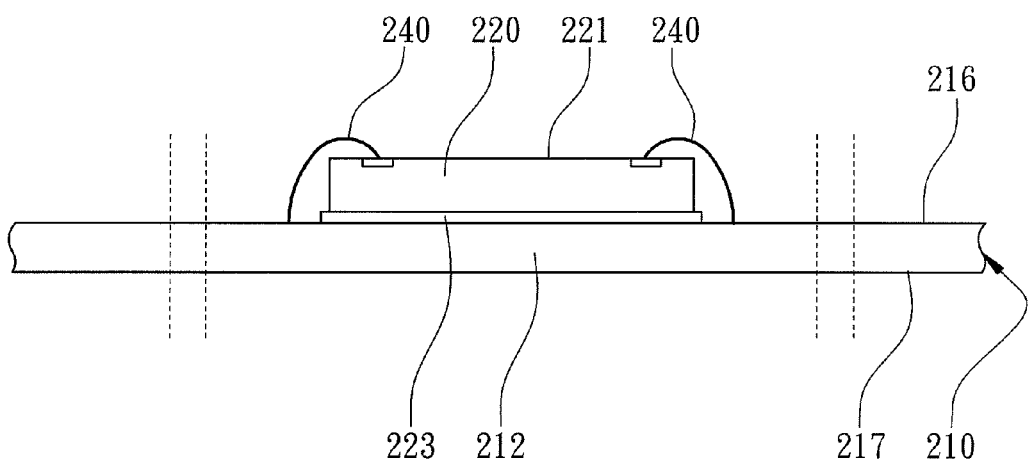
Figure 7C:
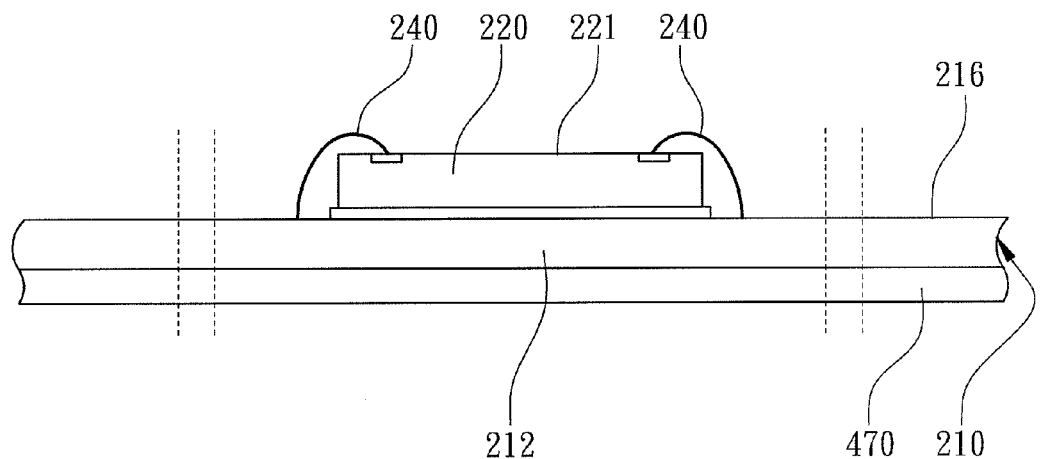

As shown in FIG. 7A, a provided substrate strip 210 includes a plurality of substrate units 212 arranged in a matrix. As shown in FIG. 7B, a plurality of chips 220 are disposed on top of the substrate units 212 and are electrically connected to the substrate units 212 by a plurality of bonding wires 240. As shown in FIG. 7C, a dicing tape 470 is disposed on the bottom surface 217 of the substrate strip 210 to carry the substrate strip 210.

Figure 7D:
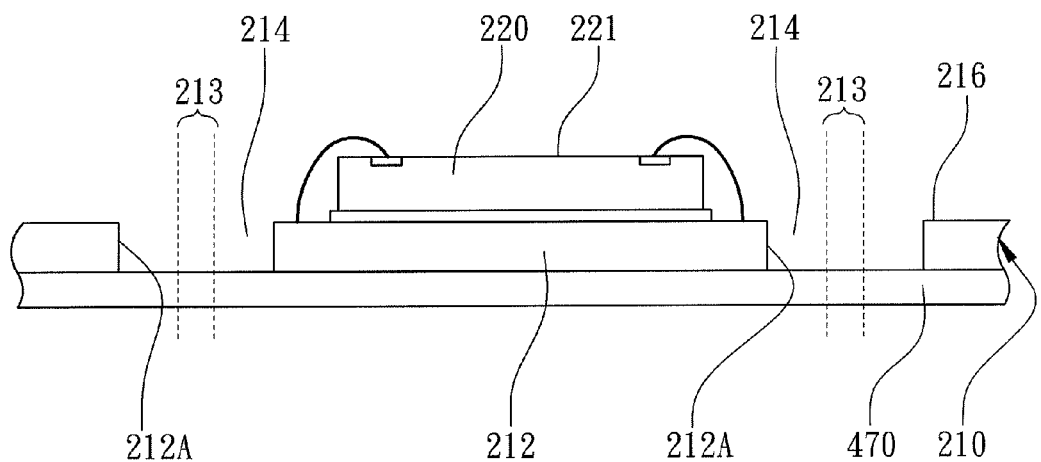

As shown in FIG. 7D, a plurality of pre-cut grooves 214 are formed on the substrate strip 210 by a pre-singulating step. The pre-cut grooves 214 have a width greater the width of the scribe lines 213. In the present embodiment, the pre-cut grooves 214 are formed at the peripheries of the substrate units 212 by a cutting tool along the scribe lines 213 with the dicing tape 470 disposed on the bottom surface 217 of the substrate strip 210 where the dicing tape 470 is able to firmly hold the individual substrate units 212 in the same position on the substrate strip 210 before encapsulating processes even after the pre-cut grooves 214 are formed by cutting through the substrate strip 210. Moreover, the pre-cut grooves 214 are interconnected to each other.

Figure 7E:
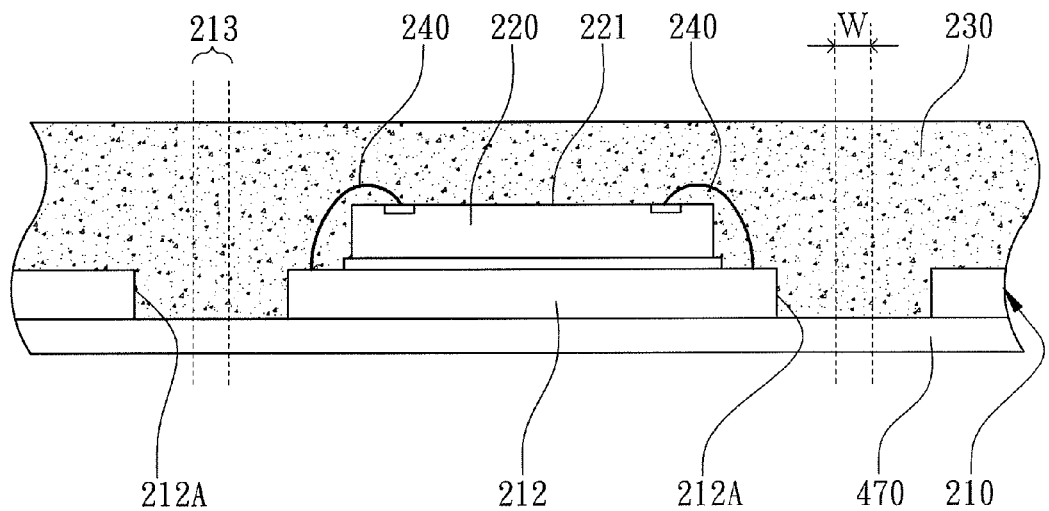

As shown in FIG. 7E, an encapslant 230 is formed on the matrix of the substrate strip 210 by molding to continuously encapsulate the substrate units 212 and the scribe lines 213, the pre-cut grooves 214 between the substrate units 212 and the chips 220 are also encapsulated. During the encapsulating processes, the encapulant 230 fills into the pre-cut grooves 214 to further encapsulate the cut edges 212A of the substrate units 212.

Figure 7F:
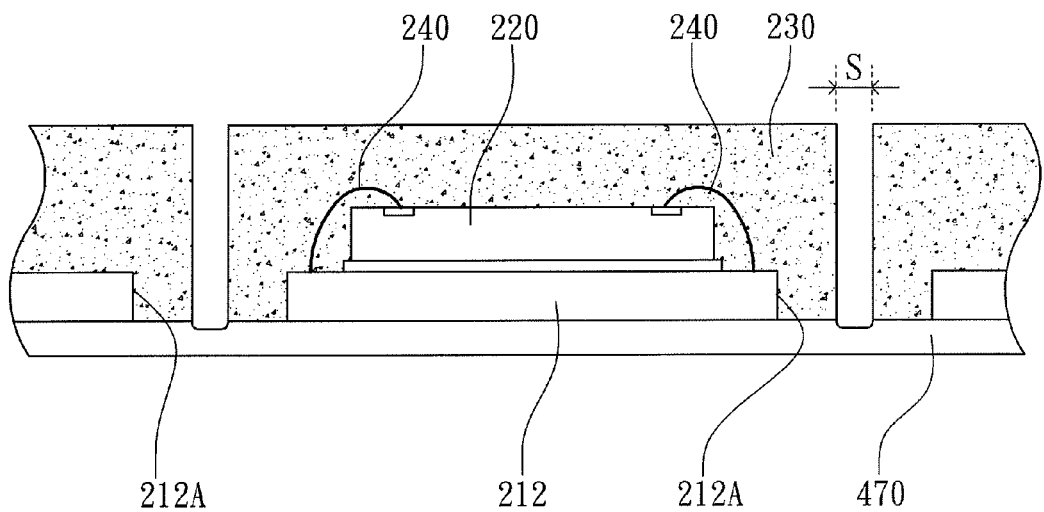
Figure 7G:
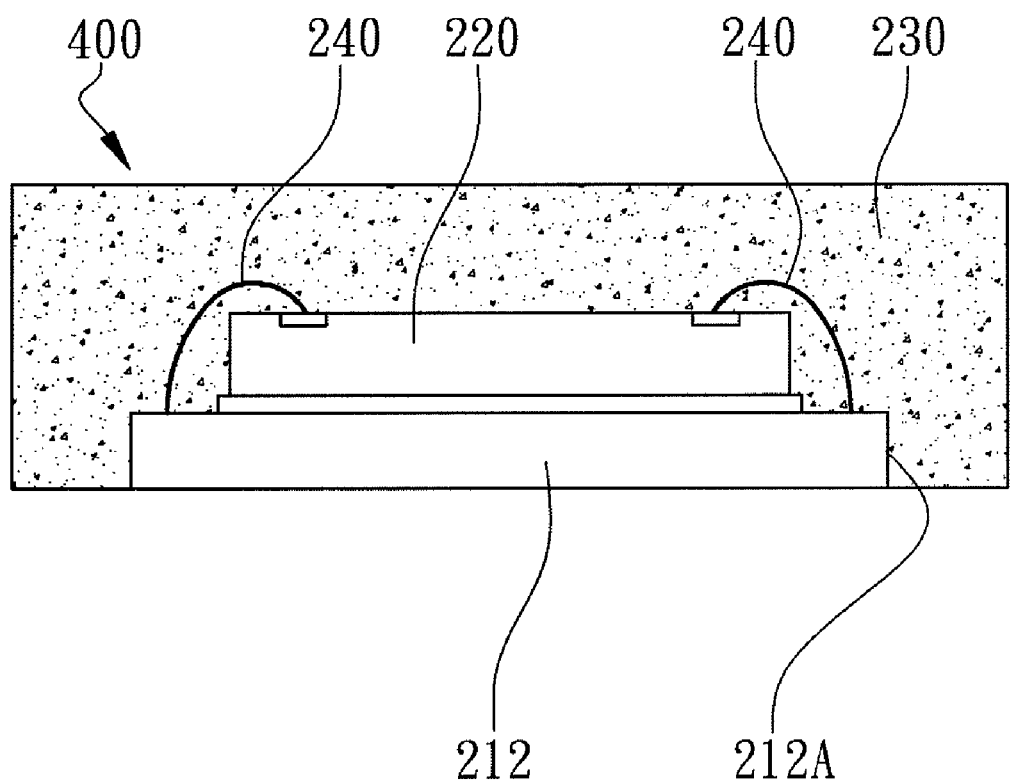

As shown in FIG. 7F, the substrate units 212 are re-singulated along the scribe lines 213 by removing the portion of the encapsulant 230 within the scribe lines 213 to be a plurality of separate semiconductor packages 400 with the cut edges 212A of the substrate units 212 still encapsulated by remains of the encapsulant 230. The dicing blade will not cut through the dicing tape 470 to ensure that the dicing tape 470 still can carry and firmly hold the singulated substrate units 212 after the re-singulation processes. Then, as shown in FIG. 7F and FIG. 7G a plurality of individual semiconductor packages 400 are obtained after removing the dicing tape 470. Since the semiconductor packages 400 are individually adhered on the dicing tape 470, the semiconductor packages 400 can be picked up one-by-one after UV irradiation of the dicing tape 470.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. An MAP method comprising:
   providing a substrate strip including a plurality of substrate units arranged in an N by M matrix and a plurality of scribe lines defined between adjacent substrate units and at the peripheries of the matrix, wherein the substrate units have a same dimension corresponding to the dimension of a semiconductor package;
   pre-singulating the substrate units so that the substrate strip has a plurality of pre-cut grooves formed between adjacent substrate units and at the peripheries of the matrix, wherein the width of the pre-cut grooves is greater than the width of the corresponding scribe lines to expose a plurality of cut edges of the substrate units out of the scribe lines;
   disposing a plurality of chips on the substrate units;
   electrically connecting the chips to the substrate units;
   forming an encapsulant on the N by M matrix of the substrate strip by molding to continuously encapsulate the substrate units and to cover the scribe lines, wherein the encapsulant fills into the pre-cut grooves and further encapsulates the cut edges of the substrate units; and
   removing a portion of the encapsulant within the scribe lines to divide the N by M matrix into separate semiconductor packages corresponding to the substrate units with the cut edges of the substrate units still encapsulated by remains of the encapsulant.

2. The MAP method as claimed in claim 1, wherein the substrate strip further has a plurality of central slots formed in the substrate units, wherein a plurality of active surfaces of the chips are attached to the substrate strip with a plurality of electrodes of the chips aligned to and exposed from the central slots during the step of disposing the chips.

3. The MAP method as claimed in claim 2, wherein the step of electrically connecting the chips includes forming a plurality of bonding wires by passing through the central slots to electrically connect the chips to the substrate units.

4. The MAP method as claimed in claim 2, wherein the step of electrically connecting the chips includes bonding a plurality of inner leads formed on the substrate strip and suspending over the central slots to the electrodes of the chips.

5. The MAP method as claimed in claim 4, further comprising a step of attaching a protecting tape on a bottom surface of the substrate strip before the step of forming the encapsulant.

6. The MAP method as claimed in claim 1, wherein the substrate strip further has a plurality of crisscross bars formed at a plurality of corners of the substrate units to diagonally connect non-adjacent substrate units during the step of pre-singulating the substrate units.

7. The MAP method as claimed in claim 1, further comprising a step of placing a plurality of solder balls on a bottom surface of the substrate strip after the step of forming the encapsulant and before the step of removing the portion of the encapsulant.

8. The MAP method as claimed in claim 1, wherein the removed gaps of the encapsulant in the step of removing the portion of the encapsulant have a width the same as the width of the scribe lines.

9. An MAP method comprising:
 providing a plurality of substrate units arranged in a matrix within a substrate strip, the substrate strip having a plurality of scribe lines defined between adjacent substrate units and a plurality of pre-cut grooves formed between adjacent substrate units and at the peripheries of the matrix, wherein the width of the pre-cut grooves is greater than the width of the scribe lines to expose a plurality of cut edges of the substrate units out of the scribe lines;
 forming an encapsulant by molding on the matrix of the substrate strip to continuously encapsulate the substrate units and the scribe lines and to fill into the pre-cut grooves to further encapsulate the cut edges of the substrate units; and
 removing a portion of the encapsulant within the scribe lines to divide the matrix into separate semiconductor packages with the cut edges of the substrate units still encapsulated by remains of the encapsulant.

10. The MAP method as claimed in claim 9, wherein a plurality of chips are disposed on and electrically connected to the corresponding substrate units before the step of forming the encapsulant.

11. The MAP method as claimed in claim 10, further comprising a step of attaching a dicing tape to a bottom surface of the substrate strip after the chips are disposed and before the step of forming the encapsulant.

12. The MAP method as claimed in claim 10, wherein the pre-cut grooves are formed after the chips are disposed.

13. The MAP method as claimed in claim 9, wherein the substrate strip further has a plurality of crisscross bars formed at a plurality of corners of the substrate units to diagonally connect non-adjacent substrate units.

14. The MAP method as claimed in claim 9, wherein the removed gaps of the encapsulant in the step of removing the portion of the encapsulant have a width the same as the width of the scribe lines.

\* \* \* \* \*